(12) United States Patent
Tang et al.

(10) Patent No.: US 10,566,398 B2
(45) Date of Patent: Feb. 18, 2020

(54) ORGANIC LIGHT EMITTING DIODE (OLED) DISPLAY PANEL HAVING PROTRUSIONS ON SUBSTRATE WITH PLURALITY OF PLANARIZATION LAYERS AND METHOD FOR MANUFACTURING SAME

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Jia Tang, Shenzhen (CN); Xiaoxing Zhang, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 191 days.

(21) Appl. No.: 15/574,621

(22) PCT Filed: Nov. 1, 2017

(86) PCT No.: PCT/CN2017/108862
§ 371 (c)(1),
(2) Date: Nov. 16, 2017

(87) PCT Pub. No.: WO2019/051955
PCT Pub. Date: Mar. 21, 2019

(65) Prior Publication Data
US 2019/0214444 A1    Jul. 11, 2019

(30) Foreign Application Priority Data

Sep. 15, 2017   (CN) .......................... 2017 1 0831096

(51) Int. Cl.
*H01L 29/08* (2006.01)
*H01L 33/00* (2010.01)
(Continued)

(52) U.S. Cl.
CPC .......... *H01L 27/3258* (2013.01); *H01L 21/84* (2013.01); *H01L 27/12* (2013.01);
(Continued)

(58) Field of Classification Search
CPC ............. H01L 27/3258; H01L 27/1218; H01L 27/1262; H01L 27/3246; H01L 27/32; H01L 21/84
See application file for complete search history.

(56) References Cited

U.S. PATENT DOCUMENTS

2012/0235178 A1*   9/2012   Mori ................... H01L 27/3211
                                                                    257/88
2015/0168763 A1    6/2015   Kim et al.
(Continued)

FOREIGN PATENT DOCUMENTS

CN          104332561 A        2/2015
CN          104733490 A        6/2015
(Continued)

*Primary Examiner* — Alonzo Chambliss
(74) *Attorney, Agent, or Firm* — Hauptman Ham, LLP

(57) ABSTRACT

The present invention provides a method for manufacturing an organic light emitting diode (OLED) display panel, the method comprises: a step S10 of providing a thin film transistor (TFT) array substrate, the TFT array substrate comprising protrusions formed on a surface of the TFT array substrate; a step S20 of forming a first planarization layer on the surface of the TFT array substrate; and a step S30 of forming a second planarization layer on a surface of the first planarization layer.

18 Claims, 1 Drawing Sheet

(51) Int. Cl.
  *H01L 31/0232*    (2014.01)
  *H01L 21/00*     (2006.01)
  *H01L 51/40*     (2006.01)
  *H01L 27/32*     (2006.01)
  *H01L 27/12*     (2006.01)
  *H01L 21/84*     (2006.01)

(52) U.S. Cl.
  CPC ...... *H01L 27/1218* (2013.01); *H01L 27/1262* (2013.01); *H01L 27/32* (2013.01); *H01L 27/3246* (2013.01); *H01L 2227/323* (2013.01)

(56) References Cited

U.S. PATENT DOCUMENTS

| | | | |
|---|---|---|---|
| 2016/0020226 A1* | 1/2016 | Cheng | H01L 27/1218 257/72 |
| 2016/0372711 A1 | 12/2016 | Song et al. | |
| 2017/0186824 A1 | 6/2017 | Lee et al. | |
| 2018/0294434 A1* | 10/2018 | Niu | H01L 51/5243 |

FOREIGN PATENT DOCUMENTS

| | | | |
|---|---|---|---|
| CN | 104733491 A | 6/2015 | |
| CN | 106206426 A | 12/2016 | |
| CN | 106935626 A | 7/2017 | |

* cited by examiner

ORGANIC LIGHT EMITTING DIODE (OLED) DISPLAY PANEL HAVING PROTRUSIONS ON SUBSTRATE WITH PLURALITY OF PLANARIZATION LAYERS AND METHOD FOR MANUFACTURING SAME

CROSS REFERENCE TO RELATED APPLICATION

This application claims the priority of International Application No. PCT/CN2017/108862, filed on 2017 Nov. 1, which claims priority to Chinese Application No. 201710831096.X, filed on 2017 Sep. 15. The entire disclosures of each of the above applications are incorporated herein by reference.

BACKGROUND OF THE INVENTION

Field of Invention

The present invention relates to display fields, and particularly to an organic light emitting diode (OLED) display panel and a method for manufacturing the OLED display panel.

Description of Prior Art

Organic light emitting diodes (OLEDs) have self-luminosity, fast response times, wide viewing angles, and other characteristics, and have wide application prospects.

For evaporation of active-matrix organic light emitting diodes (AMOLEDs), evaporating materials formed in the pixel area have good uniformity, and have low requirements for flatness of a substrate of the pixel area, but because ink of AMOLED flows when printed on the pixel area by IJP (ink jet printing) process, the flatness of the substrate of the pixel area is a main factor for spreading performance of the ink. A maximum mismatch of the total pixel area is the smaller the better, when a maximum mismatch of the total pixel area is beyond a threshold value, spreading performance of the ink is not uniform, which eventually affects luminosity. More stringent requirements are needed for flattening capacity of a flattened layer PLN of IJP-AMOLED.

PLN is organic photosensitive material. Current technology thickens the PLN film. If the mismatch is greater, thickness of the PLN film is greater. Problems and possible risks are 1) a one time flattening capacity of PLN is limited, PLN has a large thickness, but the flatness fails to meet requirements, and 2) because PLN uses a hole design, a deeper hole affects a following film deposition, such as broken climbing lines.

In view of above, in conventional IJP-AMOLED process, a flattened layer is difficult to meet a required flatness, maximum mismatch of the total pixel area is large, the spreading performance of ink is not uniform, thickness of the light emitting layer after drying is not uniform, which affects display performance of OLED display panel.

SUMMARY OF THE INVENTION

The present invention provides a method for manufacturing an OLED display panel to improve the flatness of the flattened layer and to solve the flattened layer being difficult to meet a required flatness and the thickness of the light emitting layer after drying being not uniform, and that affects a display performance of OLED display panel.

For the above-mentioned objective, the present disclosure employs the following technical schemes.

A method for manufacturing an OLED display panel, the method comprising:

a step S10 of providing a thin film transistor (TFT) array substrate, wherein the TFT array substrate comprising protrusions formed on a surface of the TFT array substrate;

a step S20 of forming a first planarization layer on the surface of the TFT array substrate, wherein a thickness of the first planarization layer is greater than a height of the protrusion; and a step S30 of forming a second planarization layer on a surface of the first planarization layer, wherein a thickness of the second planarization layer is greater than or equal to the thickness of the first planarization layer.

In one exemplary embodiment, in the method for manufacturing the OLED display panel, the step S20 further comprises:

a step S201 of forming a first through hole in a corresponding region of the first planarization layer; and wherein the step S30 further comprises:

a step S301 of forming a second through hole in a corresponding region of the second planarization layer, and the second through hole is arranged on and aligned with the first through hole.

In one exemplary embodiment, in the method for manufacturing the OLED display panel, a diameter of the second through hole is greater than a diameter of the first through hole, and a step-like through hole is defined by the first through hole and the second through hole.

In one exemplary embodiment, in the method for manufacturing the OLED display panel, the method further comprises:

a step S40 of forming an anode metal layer on a surface of the second planarization layer, and patterning the anode metal layer to form an anode metal pattern, wherein the anode metal pattern array comprises at least two anode metal patterns;

a step S50 of forming a pixel definition dam array on the surface of the second planarization layer, wherein the pixel definition dam array comprises at least two pixel definition dams, and one of the pixel definition dams is arranged between two of the anode metal patterns adjacent to each other; and a step S60 of filling a luminescent material in a pixel region formed within the pixel definition dam.

In one exemplary embodiment, in the method for manufacturing the OLED display panel, the method further comprises:

a step S40 of forming a third planarization layer on a surface of the second planarization layer; and wherein the step 40 further comprises:

a step S401 of forming a third through hole in a corresponding region of the third planarization layer, wherein the third through hole is arranged on and aligned with the second through hole.

In one exemplary embodiment, in the method for manufacturing the OLED display panel, a diameter of the third through hole is greater than the diameter of the second through hole, and a step-like through hole is defined by the first through hole, the second through hole and the third through hole.

In one exemplary embodiment, in the method for manufacturing the OLED display panel, the first planarization layer is made of polyimide material, and the second planarization layer is made of polymethylmethacrylate material.

In one exemplary embodiment, in the method for manufacturing the OLED display panel, both of the first planarization layer and the second planarization layer are made of polyimide material.

In one exemplary embodiment, in the method for manufacturing the OLED display panel, A method for manufacturing an OLED display panel, comprising:

a step S10 of providing a thin film transistor (TFT) array substrate, wherein the TFT array substrate comprises a protrusion formed on a surface of the TFT array substrate;

a step S20 of forming a first planarization layer on the surface of the TFT array substrate, wherein a thickness of the first planarization layer is greater than a height of the protrusion; and a step S30 of forming a second planarization layer on a surface of the first planarization layer.

In one exemplary embodiment, in the method for manufacturing the OLED display panel, the step S20 further comprises:

a step S201 of forming a first through hole in a corresponding region of the first planarization layer; and wherein the step S30 further comprises:

a step S301 of forming a second through hole in a corresponding region of the second planarization layer, wherein the second through hole is arranged on and aligned with the first through hole.

In one exemplary embodiment, in the method for manufacturing the OLED display panel, a diameter of the second through hole is greater than a diameter of the first through hole, and a step-like through hole is defined by the first through hole and the second through hole.

In one exemplary embodiment, in the method for manufacturing the OLED display panel, the method further comprises:

a step S40 of forming an anode metal layer on a surface of the second planarization layer, and patterning the anode metal layer to form an anode metal pattern, wherein the anode metal pattern array comprises at least two anode metal patterns;

a step S50 of forming a pixel definition dam array on the surface of the second planarization layer, wherein the pixel definition dam array comprises at least two pixel definition dams, and one of the pixel definition dams is arranged between two of the anode metal patterns adjacent to each other; and a step S60 of filling a luminescent material in a pixel region formed within the pixel definition dam.

In one exemplary embodiment, in the method for manufacturing the OLED display panel, wherein the method further comprises:

a step S40 of forming a third planarization layer on the surface of the second planarization layer; and the step 40 further comprises:

a step S401 of forming a third through hole in a corresponding region of the third planarization layer, and the third through hole is arranged on the second through hole.

In one exemplary embodiment, in the method for manufacturing the OLED display panel, a diameter of the third through hole is greater than the diameter of the second through hole, and a step-like through hole is defined by the first through hole, the second through hole and the third through hole.

In one exemplary embodiment, in the method for manufacturing the OLED display panel, the first planarization layer is made of polyimide material, and the second planarization layer is made of polymethylmethacrylate material.

In one exemplary embodiment, in the method for manufacturing the OLED display panel, both of the first planarization layer and the second planarization layer are made of polyimide material.

An OLED display panel comprising:

a thin film transistor (TFT) array substrate comprising protrusions formed on a surface thereof;

a first planarization layer formed on the surface of the TFT array substrate, wherein a thickness of the first planarization layer is greater than a height of the protrusion; and a second planarization layer formed on a surface of the first planarization layer.

Beneficial effects of the present invention is compared with the prior art method for manufacturing an OLED display panel, this application provides a method for manufacturing an OLED display panel, a flattened layer is formed by two processes improves the flatness of the flattened layer and solves the flattened layer difficultly in meeting a required flatness and the thickness of the light emitting layer, after drying, being not uniform, which affects display performance of OLED display panel.

BRIEF DESCRIPTION OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF THE PREFERRED EMBODIMENTS

Figure 1:
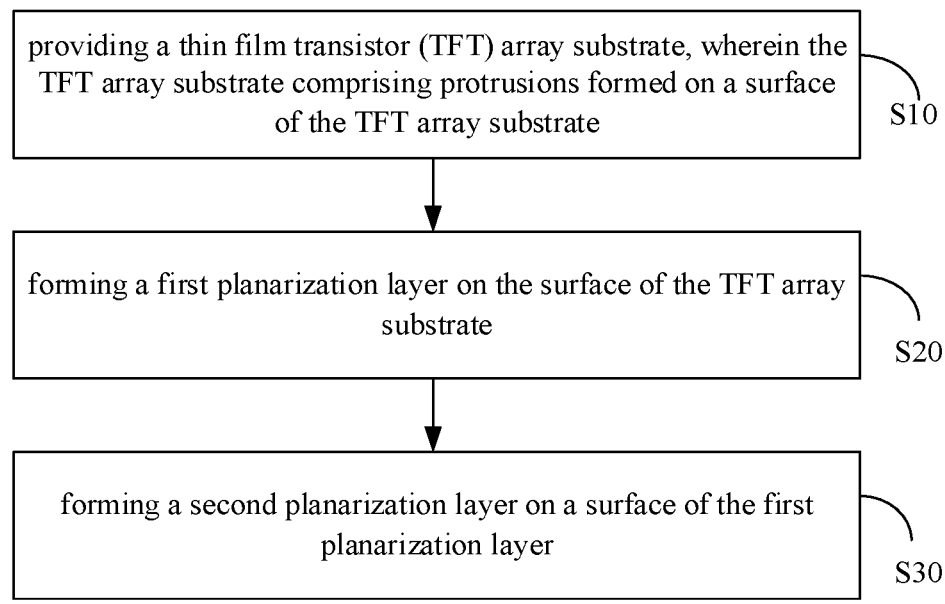
FIG. 1 is a flowchart of a method for manufacturing an OLED display panel according to one exemplary embodiment of the present disclosure.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

This application solves problems in conventional IJP-AMOLED process, the problems is the flattened layer being difficult to meet a required flatness and the thickness of the light emitting layer after drying being not uniform, and that affects a display performance of OLED display panel.

Referring to FIG. 1, FIG. 1 provides a method for manufacturing an OLED display panel, the method comprises following steps.

Step S10, providing a thin film transistor (TFT) array substrate, wherein the TFT array substrate comprising protrusions formed on a surface of the TFT array substrate.

The step S10 further comprises a step S101 of providing a substrate and a step S102 of forming TFT components on a surface of the substrate. During a process of forming TFT components, scan lines or data lines are formed at the same time. The scan lines are connected to gate electrodes of the TFT components. The data lines are connected to source electrodes of the TFT components. The protrusions are formed in regions of the scan lines corresponding to the data lines.

Step S20, forming a first planarization layer on the surface of the TFT array substrate, wherein a thickness of the first planarization layer is greater than a height of the protrusions. In detail, photosensitive materials are formed on the surface of the TFT array substrate, a thickness of the photosensitive materials are two times more than the height of the protrusions, and the first planarization layer is formed from the photosensitive materials by curing.

After curing, a thickness of the first planarization layer corresponding to the protrusions is less than a thickness of the first planarization layer corresponding to other regions.

Step S30, forming a second planarization layer on a surface of the first planarization layer. In detail, photosensitive materials are formed on the surface of the first planarization layer, the second planarization layer is formed from the photosensitive materials by curing. A height of the second planarization layer corresponding to the protrusions is equal to a height of the second planarization layer corresponding to other regions.

After forming the first planarization layer, the second planarization layer is formed by a mismatch of the TFT substrate. For example, when maximum mismatch is small, the thickness of the second planarization layer is equal to the thickness of the first planarization layer. In a further example, when maximum mismatch is small, the thickness of the second planarization layer is greater than the thickness of the first planarization layer For example, after forming the second planarization layer, when maximum mismatch is greater than a certain value range, a third planarization layer can be formed on the surface of the second planarization layer to reduce maximum mismatch into the certain value range.

The method for manufacturing the OLED display panel further comprises steps of manufacturing an OLED light emitting component.

Step S40, forming an anode metal layer on a surface of the second planarization layer, and patterning the anode metal layer to form an anode metal pattern.

Step S50, forming a pixel definition dam array on the surface of the second planarization layer, one of the pixel definition dams is arranged between two of the anode metal patterns adjacent to each other. The pixel definition dams is made of hydrophobic materials.

Step S60, filling a luminescent material in a pixel region formed within the pixel definition dam. The luminescent material is formed by printing ink.

Step S70, forming a cathode metal layer on the luminescent material.

The step S20 further comprises a step S201 of forming a first through hole in a corresponding region of the first planarization layer. For example, the first through hole corresponds to the pixel region to connect the OLED light emitting component with the TFT component. For example, the first through hole is formed in a non-display region of the OLED display panel to connect the TFT component with the driving chip.

The step S30 further comprises a step S301 of forming a second through hole in a corresponding region of the second planarization layer, and the second through hole is arranged on and aligned with the first through hole.

A diameter of the second through hole is greater than a diameter of the first through hole to form a step-like through hole combined by the first through hole and the second through hole and to buffer a climbing of electrode film and to avoid climbing line broken.

When the third planarization layer is formed on the surface of the second planarization layer, a third through hole is formed in a region corresponding to the third planarization layer. The third through hole is arranged on and corresponds to the second through hole. A diameter of the third through hole is greater than the diameter of the second through hole. A step-like through hole is combined by the third through hole and the second through hole, and the third through hole to buffer a climbing of electrode film and to avoid climbing line broken.

In one exemplary embodiment, the first planarization layer is made of polyimide material, the second planarization layer is made of polymethylmethacrylate material. A film formed by polyimide material and a film formed by polymethylmethacrylate material has a better insulation characteristics to make the two films tightly bond with each other and avoids stripping risks In a further example, both the first planarization layer and the second planarization layer are made of polyimide material. The polyimide (PI) material has good flexibility. Both the first planarization layer and the second planarization layer are made of flexible PI material to be suitable for a bendable OLED display device.

Figure 2:
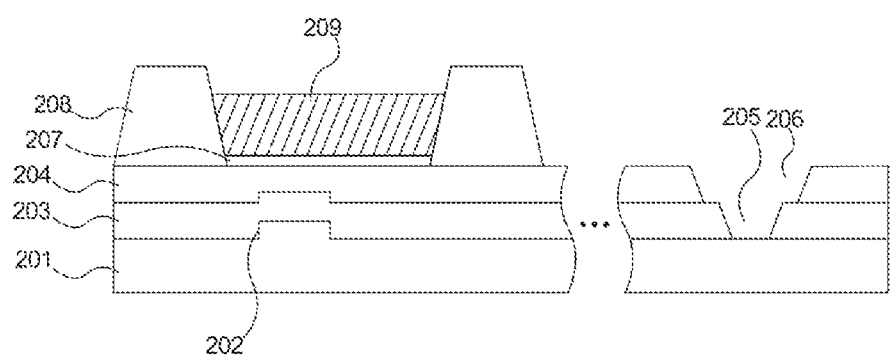
FIG. 2 is a structure diagram of an OLED display panel manufactured by the method according to one exemplary embodiment of the present disclosure.

Referring to FIG. 2, this application further provides an OLED display panel manufactured by the method for manufacturing the OLED display panel.

The OLED display panel comprise a TFT array substrate 201 comprising protrusions 202 formed on a surface thereof, a first planarization layer 203 formed on the surface of the TFT array substrate 201, wherein a thickness of the first planarization layer 203 is greater than a height of the protrusion 202, and a second planarization layer 204 formed on a surface of the first planarization layer 203.

A first through hole 205 is defined in the first planarization layer 203. A second through hole 206 is defined in the second planarization layer 204. The second through hole 206 is arranged on the first through hole 205 and combined with the first through hole 205 to form a step-like through hole.

An anode metal layer 207 is formed on the surface of the second planarization layer 204. A pixel definition dam array 208 is formed on the surface of the second planarization layer 204. One of the pixel definition dams 208 is arranged between two of the anode metal patterns adjacent to each other. Luminescent material 209 is fold in a pixel region formed within the pixel definition dam 208.

Beneficial effects of the present invention is compared with the prior art method for manufacturing an OLED display panel, this application provides a method for manufacturing an OLED display panel, a flattened layer is formed by two processes improves the flatness of the flattened layer and solves the flattened layer difficultly in meeting a required flatness and the thickness of the light emitting layer, after drying, being not uniform, which affects display performance of OLED display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A method for manufacturing an organic light emitting diode (OLED) display panel, comprising:
   a step S10 of providing a thin film transistor (TFT) array substrate, wherein the TFT array substrate comprising protrusions formed on a surface of the TFT array substrate;
   a step S20 of forming a first planarization layer on the surface of the TFT array substrate, and forming a first through hole in a corresponding region of the first planarization layer, wherein a thickness of the first planarization layer is greater than a height of the protrusion; and
   a step S30 of forming a second planarization layer on a surface of the first planarization layer, and forming a second through hole in a corresponding region of the second planarization layer, wherein the second through hole is arranged on and aligned with the first through hole, and wherein a thickness of the second planarization layer is greater than or equal to the thickness of the first planarization layer.

2. The method of claim 1, wherein a diameter of the second through hole is greater than a diameter of the first through hole, and a step-like through hole is defined by the first through hole and the second through hole.

3. The method of claim 1, wherein the method further comprises:
   a step S40 of forming an anode metal layer on a surface of the second planarization layer, and patterning the anode metal layer to form an anode metal pattern, wherein the anode metal pattern array comprises at least two anode metal patterns;
   a step S50 of forming a pixel definition dam array on the surface of the second planarization layer, wherein the pixel definition dam array comprises at least two pixel definition dams, and one of the pixel definition dams is arranged between two of the anode metal patterns adjacent to each other; and
   a step S60 of filling a luminescent material in a pixel region formed within the pixel definition dam.

4. The method of claim 1, wherein the first planarization layer is made of polyimide material, and the second planarization layer is made of polymethylmethacrylate material.

5. The method of claim 1, wherein both of the first planarization layer and the second planarization layer are made of polyimide material.

6. A method for manufacturing an organic light emitting diode (OLED) display panel, comprising:
   a step S10 of providing a thin film transistor (TFT) array substrate, wherein the TFT array substrate comprises a protrusion formed on a surface of the TFT array substrate;
   a step S20 of forming a first planarization layer on the surface of the TFT array substrate, and forming a first through hole in a corresponding region of the first planarization layer, wherein a thickness of the first planarization layer is greater than a height of the protrusion; and
   a step S30 of forming a second planarization layer on a surface of the first planarization layer, and forming a second through hole in a corresponding region of the second planarization layer, wherein the second through hole is arranged on and aligned with the first through hole.

7. The method of claim 6, wherein a diameter of the second through hole is greater than a diameter of the first through hole, and a step-like through hole is defined by the first through hole and the second through hole.

8. The method of claim 6, wherein the method further comprises:
   a step S40 of forming an anode metal layer on a surface of the second planarization layer, and patterning the anode metal layer to form an anode metal pattern, wherein the anode metal pattern array comprises at least two anode metal patterns;
   a step S50 of forming a pixel definition dam array on the surface of the second planarization layer, wherein the pixel definition dam array comprises at least two pixel definition dams, and one of the pixel definition dams is arranged between two of the anode metal patterns adjacent to each other; and
   a step S60 of filling a luminescent material in a pixel region formed within the pixel definition dam.

9. The method of claim 6, wherein the first planarization layer is made of polyimide material, and the second planarization layer is made of polymethylmethacrylate material.

10. The method of claim 6, wherein both of the first planarization layer and the second planarization layer are made of polyimide material.

11. An organic light emitting diode (OLED) display panel, comprising:
    a thin film transistor (TFT) array substrate comprising protrusions formed on a surface thereof;
    a first planarization layer formed on the surface of the TFT array substrate, a first through hole formed in a corresponding region of the first planarization layer, wherein a thickness of the first planarization layer is greater than a height of the protrusion; and
    a second planarization layer formed on a surface of the first planarization layer, a second through hole formed in a corresponding region of the second planarization layer, wherein the second through hole is arranged on and aligned with the first through hole.

12. The OLED display panel of claim 11, wherein a thickness of the second planarization layer is greater than or equal to the thickness of the first planarization layer.

13. The OLED display panel of claim 11, wherein a diameter of the second through hole is greater than a diameter of the first through hole, and a step-like through hole is defined by the first through hole and the second through hole.

14. The OLED display panel of claim 11, wherein an anode metal layer is formed on a surface of the second planarization layer, an anode metal pattern is formed in the anode metal layer, and the anode metal pattern array comprises at least two anode metal patterns.

15. The OLED display panel of claim 14, wherein a pixel definition dam array is formed on the surface of the second planarization layer, wherein the pixel definition dam array comprises at least two pixel definition dams, and one of the pixel definition dams is arranged between two of the anode metal patterns adjacent to each other.

16. The OLED display panel of claim 15, wherein a luminescent material is filled in a pixel region formed within the pixel definition dam.

17. The OLED display panel of claim 11, wherein the first planarization layer is made of polyimide material, and the second planarization layer is made of polymethylmethacrylate material.

18. The OLED display panel of claim 11, wherein both of the first planarization layer and the second planarization layer are made of polyimide material.

* * * * *